(12) United States Patent
Nozawa et al.

(10) Patent No.: US 7,903,455 B2
(45) Date of Patent: Mar. 8, 2011

(54) MAGNETIC MEMORY DEVICE

(75) Inventors: Mai Nozawa, Kawasaki (JP); Masanori Furuta, Mishima (JP); Daisuke Kurose, Kawasaki (JP); Tsutomu Sugawara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/328,546

(22) Filed: Dec. 4, 2008

(65) Prior Publication Data

US 2009/0219753 A1    Sep. 3, 2009

(30) Foreign Application Priority Data

Feb. 28, 2008   (JP) ................................. 2008-048577

(51) Int. Cl.
*G11C 11/00* (2006.01)
(52) U.S. Cl. ..................................... 365/158; 365/230.06
(58) Field of Classification Search .................. 365/158, 365/230.06
See application file for complete search history.

(56) References Cited

U.S. PATENT DOCUMENTS
2005/0232006 A1* 10/2005 Iwata ............................ 365/171

FOREIGN PATENT DOCUMENTS
JP       2004-158162       6/2004

OTHER PUBLICATIONS

Ueda et al.; "Design of Low Read Bias Voltage and High Speed Sense Amplifier for STT-MRAM", Technical Report of IEICE, ICD, pp. 1-6, Apr. 2007, with English Abstract.
Furuta et al., U.S. Appl. No. 12/343,353, filed Dec. 23, 2008, entitled "Magnetic Storage Device".
Ueda et al.; "Design of Low Read Bias Voltage and High Speed Sense Amplifier for STT-MRAM", Technical Report of IEICE, ICD, pp. 1-6, Abstract.
Sugimoto et al.; "A Low-Voltage, High-Speed and Low-Power Full Current-Mode Video-Rate CMOS A/D Converter"; Proc. of Eur. Solid State Circuits Conf., pp. 392-395, (1997).

* cited by examiner

*Primary Examiner* — Michael T Tran
(74) *Attorney, Agent, or Firm* — Finnegan, Henderson, Farabow, Garrett & Dunner, L.L.P.

(57) ABSTRACT

A magnetic memory device including a plurality of word lines, a plurality of bit lines which intersect the word lines and are put into groups, a plurality of memory cells which are arranged at intersections between the bit lines and the word lines, each memory cell including a magnetic element and a transistor which are connected in series, a first decoder which sequentially selects the word lines, a second decoder which sequentially drives the bit lines of each group, a weighting adder which performs weighting addition of currents flowing on bit lines in a selected group to generate an added current signal, a current/voltage converter which converts the added current signal into a voltage signal, and an analog-to-digital converter which digitizes the voltage signal.

30 Claims, 3 Drawing Sheets

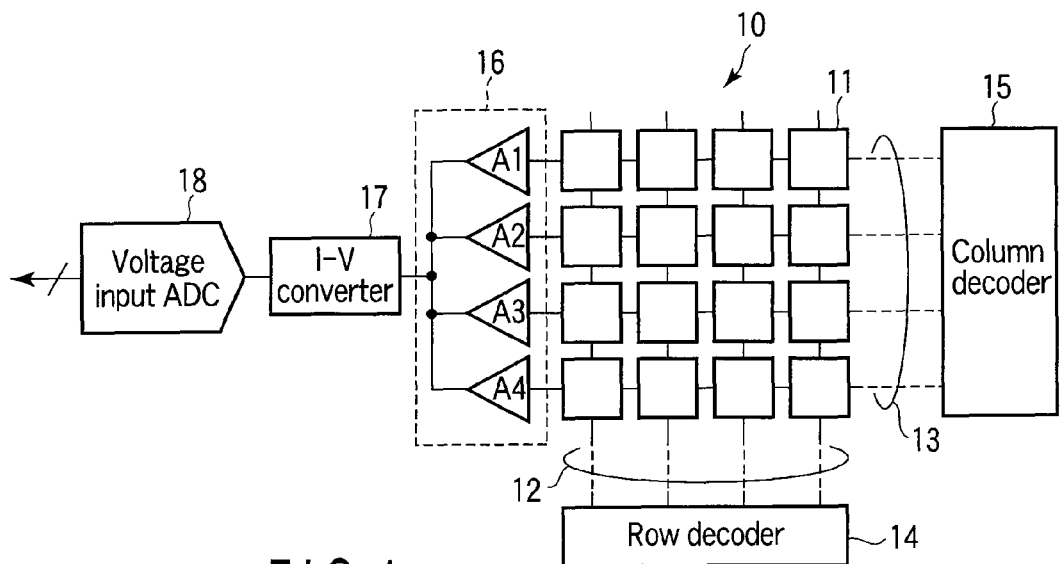
FIG. 1
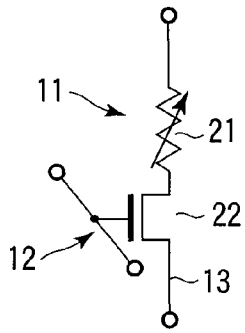
FIG. 2
| Iin4 | Iin3 | Iin2 | Iin1 | Itotal |
|---|---|---|---|---|
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
| 1 | 0 | 1 | 0 | 10 |
| 1 | 0 | 1 | 1 | 11 |
| 1 | 1 | 0 | 0 | 12 |
| 1 | 1 | 0 | 1 | 13 |
| 1 | 1 | 1 | 0 | 14 |
| 1 | 1 | 1 | 1 | 15 |
FIG. 3

MAGNETIC MEMORY DEVICE

CROSS-REFERENCE TO RELATED APPLICATIONS

This application is based upon and claims the benefit of priority from prior Japanese Patent Application No. 2008-048577, filed Feb. 28, 2008, the entire contents of which are incorporated herein by reference.

BACKGROUND OF THE INVENTION

1. Field of the Invention

The present invention relates to a magnetic memory device and, more particularly, to a data read circuit.

2. Description of the Related Art

A magnetic random access memory (MRAM) has a basic structure in which memory cells are arranged at the intersections between bit lines and word lines arranged in a matrix. Each memory cell includes a magnetic tunnel junction (MTJ) element, and a transistor which performs a switching operation. The MTJ element and the transistor are connected in series.

One terminal of each of the memory cells of the same row is connected to a bit line. The other terminal of each of the memory cells of the same column, i.e., the gate terminal of each transistor is connected to a word line. In data read, only transistors connected to a selected word line are turned on to form a current path. As a result, a current flows to only selected MTJ elements. This makes it possible to read data stored in the MTJ elements.

The operation of reading stored data is done by applying a predetermined driving voltage across each memory cell, and in this state, causing a sense amplifier to detect the current flowing to the bit line. For example, an MTJ element exhibits a low resistance when binary 0 is stored and a high resistance when binary 1 is stored. For this reason, a current flowing to a memory cell that stores binary 0 is larger than that flowing to a memory cell that stores binary 1. The sense amplifier compares a reference current with the current flowing to the memory cell, thereby determining whether the stored data is 0 or 1.

In the general read circuit of a conventional MRAM, sense amplifiers are individually connected to the bit lines, and data is read from each word line. However, the circuit scale of a sense amplifier is large, and it is therefore actually difficult to connect one sense amplifier to each bit line as the microfabrication and integration of the MRAM progress. A technique of coping with the high integration has been proposed, in which a plurality of adjacent bit lines share a sense amplifier, and connection of the sense amplifier and the bit lines is changed over using a switch to read data from each memory cell (e.g., Yoshihiro. UEDA et al., "Design of Low Read Bias Voltage and High Speed Sense Amplifier for STT-MRAM", Technical Report of IEICE [referred to as Document 1, hereinafter]).

In the conventional MRAM read circuit described in Document 1, the circuit scale becomes smaller than that in the method of reading data for each word line by individually connecting sense amplifiers to the bit lines. However, since data is sequentially read from each memory cell, and switching between the bit lines and the sense amplifiers takes time, the read speed decreases.

BRIEF SUMMARY OF THE INVENTION

According to an aspect of the present invention, there is provided a magnetic memory device comprising: a plurality of word lines; a plurality of bit lines which intersect the word lines and are put into groups; a plurality of memory cells which are arranged at intersections between the bit lines and the word lines, each memory cell including a magnetic element and a transistor which are connected in series; a first decoder which sequentially selects the word lines; a second decoder which sequentially drives the bit lines of each group; a weighting adder which performs weighting addition of currents flowing on bit lines in a selected group to generate an added current signal; a current/voltage converter which converts the added current signal into a voltage signal; and an analog-to-digital converter which digitizes the voltage signal.

According to another aspect of the present invention, there is provided a magnetic memory device comprising: a plurality of word lines; a plurality of bit lines which intersect the word lines and are put into groups; a plurality of memory cells which are arranged at intersections between the bit lines and the word lines, each memory cell including a magnetic element and a transistor which are connected in series;

a first decoder which sequentially selects the word lines; a second decoder which sequentially drives the bit lines of each group; a weighting adder which performs weighting addition of currents flowing on bit lines in a selected group to generate an added current signal; and an analog-to-digital converter which digitizes the added current signal.

BRIEF DESCRIPTION OF THE SEVERAL VIEWS OF THE DRAWING

FIG. 1 is a circuit diagram showing a magnetic memory device according to the first embodiment;

FIG. 2 is an equivalent circuit diagram of a memory cell;

FIG. 3 is a view for explaining the weighting addition operation of a current amplification block in FIG. 1;

DETAILED DESCRIPTION OF THE INVENTION

Figure 4:
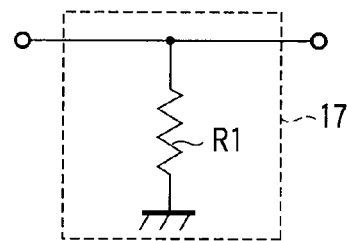
FIG. 4 is a circuit diagram showing an example of an I-V converter in FIG. 1.

The embodiments of the present invention will now be described with reference to the accompanying drawing.

First Embodiment

FIG. 1 shows the memory cell array and the data read circuit of a magnetic memory device according to the first embodiment of the present invention. A memory cell array 10 has a plurality of memory cells 11 which are arrayed in a matrix and arranged at the intersections between a plurality of word lines 12 and a plurality of bit lines 13.

As shown in FIG. 2, one memory cell 11 includes an MTJ element 21, and a transistor 22 used as a switch. The MTJ element 21 and transistor 22 are connected in series. The MTJ element 21 is a magnetic element whose resistance changes depending on stored data. For example, the MTJ element 21 exhibits a low resistance when binary 0 is stored and a high resistance when binary 1 is stored.

One terminal of each of the memory cells, e.g., the source terminal or drain terminal of each of transistor 22 of the same row is connected to a single bit line 13. The gate terminal of each of transistors 22 of the memory cells of the same column is connected to a single word line 12. A row decoder 14 is connected to the word lines 12. A column decoder 15 is connected to the bit lines 13.

In reading data stored in the memory cells 11, the row decoder 14 selects one word line 12. Only transistors 22 of the memory cells 11 connected to the selected word line 12 are turned on to form a current path. Hence, when the column decoder 15 applies a predetermined driving voltage across the memory cells 11 via the bit lines 13, a current flows to only the MTJ elements 21 selected by turning on transistors 22. The current flowing through the MTJ elements 21 flows into the bit lines 13. The data stored as the resistance of each MTJ element 21 is detected as the current on the bit line 13 in this way.

The bit lines 13 intersect the word lines 12 and are put into groups. In the example shown in FIG. 1, four bit lines 13 are put into a group. However, the number n of bit lines per group is not limited to four. In the example shown in FIG. 1, n bit lines adjacent in the column direction form a group. However, the n bit lines of one group may exist at intervals in the column direction. The column decoder 15 sequentially drives each group of bit lines 13 so that the driving voltage is applied simultaneously to the bit lines of one group.

A current amplification block 16 is provided in correspondence with each group of bit lines 13. The current amplification block 16 weights and adds the currents flowing on the bit lines 13 in a corresponding group. The current amplification block 16 includes a plurality of current amplifiers A1 to A4 connected to the n (=4) bit lines in the same group, respectively. The current amplifiers A1 to A4 have different gains (weighting factors) for the weighting addition. The current amplifiers A1 to A4 amplify the currents flowing on the corresponding bit lines 13 and output amplified currents.

The output terminals of the current amplifiers A1 to A4 are commonly connected, as shown in FIG. 1. With this common connection, the amplified currents from the current amplifiers A1 to A4 are added, and an added current signal is output to the common connection line. As described above, current addition can easily be implemented by only the operation of commonly connecting the output terminals of the current amplifiers A1 to A4 without any addition circuit as in voltage addition. When n bit lines 13 adjacent in the column direction form a group, the lead of the common connection line connected to the output terminals of the current amplifiers A1 to A4 can be reduced.

A current/voltage converter (I-V converter) 17 converts the added current signal output from the current amplification block 16 into a voltage signal. A voltage input analog-to-digital converter (ADC) 18 digitizes the voltage signal output from the I-V converter 17 for output as a data read value.

The principle of data read according to this embodiment will be described next.

As described above, a current corresponding to data stored in each MTJ element 21 selected upon turning on the corresponding transistor 22 flows on the bit line 13. Assume that when binary 0 is stored in the MTJ element 21, the current on the bit line 13 is 0, and when binary 1 is stored in the MTJ element 21, the current on the bit line 13 is 1. According to this embodiment, the current amplification block 16 weights and adds the currents on the bit lines 13 in each group. That is, the currents on the n bit lines in a group selected by the column decoder 15 are weighted and added.

If the currents on the n bit lines are simply added, an added current signal having a magnitude corresponding to the number of binary 0 and that of binary 1 stored in the MTJ elements 21 connected to the n bit lines is obtained. In this case, however, data read cannot be done because it is impossible to discriminate between the binary 0 and 1 stored in the MTJ elements 21 connected to the n bit lines.

On the other hand, if the currents on the bit lines 13 are weighted in each group, as in this embodiment, it is easy to know in accordance with the magnitude of the added current signal output from the current amplification block 16 whether binary 0 or 1 is stored in each of the MTJ elements 21 connected to the n bit lines. It is therefore possible to obtain a data read value by causing the I-V converter 17 to convert the added current signal output from the current amplification block 16 into a voltage signal and ADC 18 to digitize it.

FIG. 3 is a view showing an example of weighting addition by the current amplification block 16. Iin1, Iin2, Iin3, and Iin4 are the input currents to the current amplifiers A1 to A4 (the currents on the four bit lines in the same block), and Itotal is the added current signal. In the example shown in FIG. 3, gains (weighting factors) G1 to G4 of the current amplifiers A1 to A4 are set to have a ratio of powers of 2. That is, $G1=2^0$, $G2=2^1$, $G3=2^2$, and $G4=2^3$.

As shown in FIG. 3, the value of the added current signal Itotal is 0 when, for example, all Iin1, Iin2, Iin3, and Iin4 are 0, 1 when only Iin1 is 1, and Iin2, Iin3, and Iin4 are 0, 2 when only Iin2 is 1, and Iin1, Iin3, and Iin4 are 0, 4 when only Iin3 is 1, and Iin1, Iin2, and Iin4 are 0, and 8 when only Iin4 is 1, and Iin1, Iin2, and Iin3 are 0. That is, even when only one of Iin1, Iin2, Iin3, and Iin4 is 1, and the remaining three currents are 0, the value Itotal changes depending on which one of Iin1, Iin2, Iin3, and Iin4 is 1.

Assume that two of Iin1, Iin2, Iin3, and Iin4 are 1, and the remaining two currents are 0. The added current signal Itotal is 3 when Iin1 and Iin2 are 1, and Iin3 and Iin4 are 0, 5 when Iin1 and Iin3 are 1, and Iin2 and Iin4 are 0, 9 when Iin1 and Iin4 are 1, and Iin2 and Iin3 are 0, and 12 when Iin3 and Iin4 are 1, and Iin1 and Iin2 are 0. The value Itotal changes depending on which two of Iin1, Iin2, Iin3, and Iin4 are 1.

Even when three of Iin1, Iin2, Iin3, and Iin4 are 1, and the remaining one current is 0, the value Itotal changes depending on which three of Iin1, Iin2, Iin3, and Iin4 are 1. If all Iin1, Iin2, Iin3, and Iin4 are 1, the value Itotal is 15 that is the maximum value.

In this way, the bit lines 13 are put into groups, and the current amplification block 16 weights and adds the currents on the bit lines 13 of each group, thereby obtaining an added current signal having a magnitude corresponding to the combination of the currents Iin1, Iin2, Iin3, and Iin4 on four bit lines in the same block. It is therefore possible to obtain a read value corresponding to data stored in the memory cell array 10 by causing the I-V converter 17 to convert the added current signal into a voltage signal and ADC 18 to digitize it.

Additionally, since the data stored in the memory cell array 10 can be read at once for each word line 12, high-speed read can be performed as compared to the method of Document 1. Furthermore, the current amplifiers A1 to A4 only amplify the simply input currents on the bit lines 13 by predetermined gains. Hence, they have a circuit scale much smaller than a sense amplifier and are suitable for microfabrication and high integration of the MRAM.

Detailed examples of the respective parts in FIG. 1 will be described below.

Figure 5:
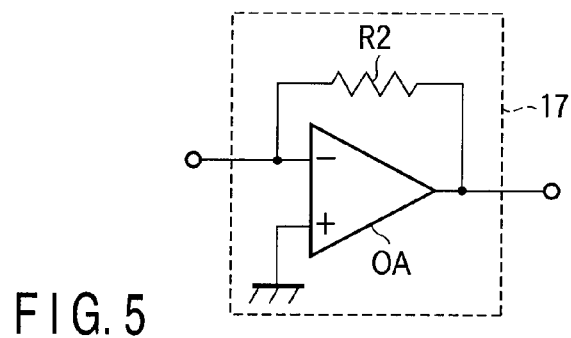
FIG. 5 is a circuit diagram showing another example of an I-V converter in FIG. 1.

The I-V converter 17 can most simply use a resistor R1, as shown in FIG. 4. However, the I-V converter 17 may be a transimpedance amplifier 17 including an operational amplifier OA and a feedback resistor R2, as shown in FIG. 5.

The output resistance of the current amplifiers A1 to A4 or the input resistance of ADC 18 also has a current-to-voltage conversion function. For this reason, the I-V converter 17 may be omitted, and the added current signal output from the current amplification block 16 may directly be input to ADC 18. However, use of the I-V converter 17 makes it possible to accurately convert the added current signal into a voltage signal and transmit it to ADC 18 without any influence of the variation of the output resistance of the current amplifiers A1 to A4 or the input resistance of ADC 18 in the manufacturing process.

Figure 6:
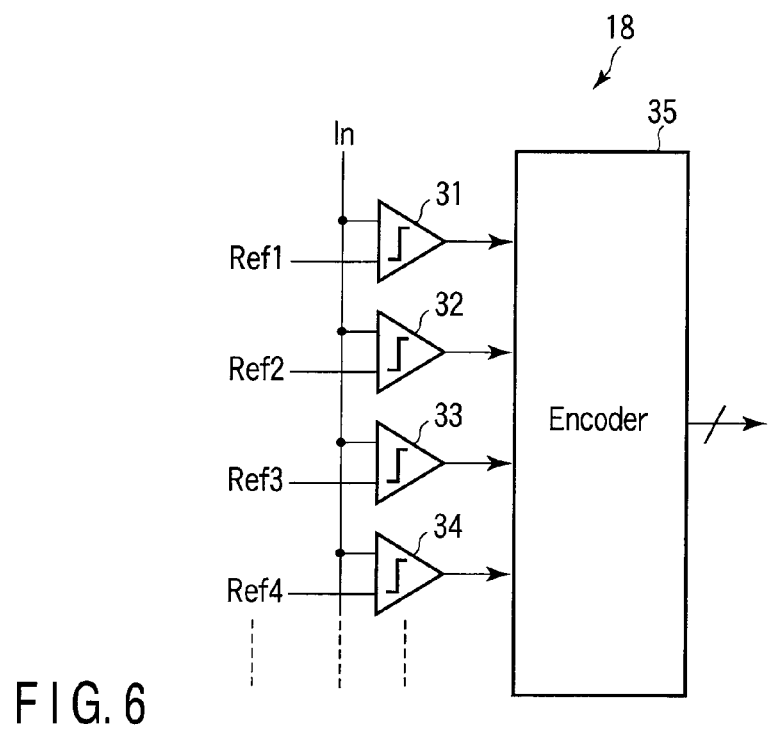
FIG. 6 is a block diagram showing a flash analog-to-digital converter as an example of an analog-to-digital converter in FIG. 3.

ADC 18 can use a flash ADC as shown in FIG. 6. The flash ADC is also called a parallel comparison ADC. A plurality of comparators 31 to 34 compare a voltage signal input to an input terminal In with different reference voltages Ref1 to Ref4. An encoder 35 converts the outputs from the comparators 31 to 34 into a binary coded digital signal. According to this embodiment, a voltage signal obtained by I-V converting the added current signal Itotal shown in FIG. 3 is input to ADC 18. Consequently, a binary coded digital signal corresponding to the combination of Iin1, Iin2, Iin3, and Iin4 shown in FIG. 3 is obtained as the output of ADC 18.

The current amplifiers A1 to A4 will be described next. Each of the current amplifiers A1 to A4 can be implemented using an amplification circuit. More simply, a current mirror circuit as shown in FIG. 7 or 8 is usable.

Figure 7:
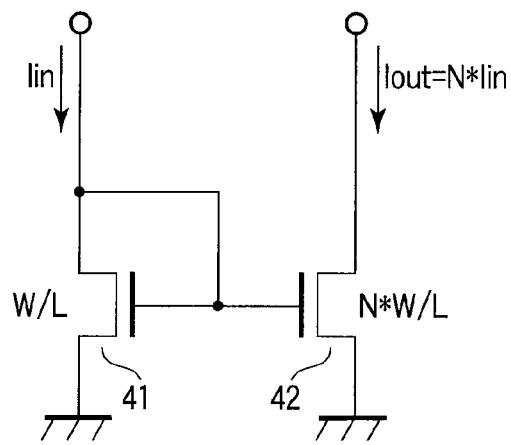
FIG. 7 is a circuit diagram showing an example of a current mirror circuit as a detailed example of a current amplifier in FIG. 1.
Figure 8:
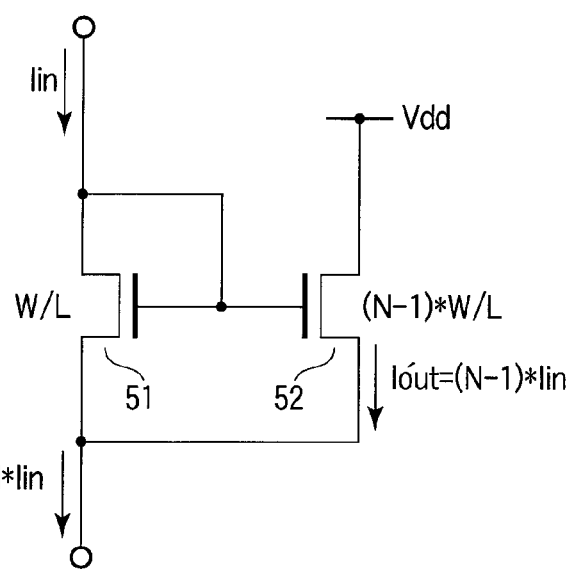
FIG. 8 is a circuit diagram showing another example of a current mirror circuit as a detailed example of a current amplifier in FIG. 1.

The current mirror circuit shown in FIG. 7 includes a diode-connected MOS transistor 41 whose drain terminal connected to the gate terminal, and a MOS transistor 42 whose gate terminal is connected to that of transistor 41. The source terminals of transistors 41 and 42 are connected to ground. An input current Iin is input to the drain terminal of transistor 41. An output current Iout is output from the drain terminal of transistor 42.

In the current mirror circuit shown in FIG. 7, the current conversion ratio (the ratio of the input and output currents) is decided by the size ratio of MOS transistors 41 and 42. The size ratio of transistors 41 and 42 is set to 1:N. More specifically, the size of a MOS transistor is represented by the gate width/gate length ratio. In the example shown in FIG. 7, when the gate width/gate length ratio of the input-side transistor 41 is W/L, the gate width/gate length ratio of the output-side transistor 42 is set to N*W/L.

In this case, the current conversion ratio, i.e., the gain of the current amplifier is N, and the output current Iout=N*Iin. Hence, if the current amplifiers A1 to A4 have different values N with, e.g., a ratio of powers of 2, the gains (weighting factors) of the current amplifiers A1 to A4 can be set as described above.

The current mirror circuit shown in FIG. 8 includes a diode-connected MOS transistor 51, and a MOS transistor 52 whose gate terminal is connected to that of transistor 51, as in FIG. 7. The source terminal of transistor 51 and that of transistor 52 are commonly connected. The drain terminal of transistor 52 is connected to a power supply Vdd. The input current Iin is input to the drain terminal of transistor 51. The output current Iout is output from the common drain terminal of transistors 51 and 52.

In the current mirror circuit shown in FIG. 8 as well, the current conversion ratio is decided by the size ratio of MOS transistors 51 and 52. In the example shown in FIG. 8, when the gate width/gate length ratio of the input-side transistor 51 is W/L, the gate width/gate length ratio of the output-side transistor 52 is set to (N−1)*W/L. In this case, the source current of transistor 52 is Iout"=(N−1)*Iin.

In the common source terminal of transistors 51 and 52, the source current Iin of transistor 51 is added to the source current Iout'=(N−1)*Iin of transistor 52 so that the output current Iout=N*Iin is obtained. In this case as well, the current conversion ratio, i.e., the gain of the current amplifier is N. Hence, if the current amplifiers A1 to A4 have different values N with, e.g., a ratio of powers of 2, the gains (weighting factors) of the current amplifiers A1 to A4 can be set as described above. In the current mirror circuit shown in FIG. 8, the size ratio of MOS transistors 51 and 52 necessary for obtaining the current conversion ratio of 1:N is 1:(N−1). Hence, the area and power consumption of the circuit can be reduced as compared to the current mirror circuit shown in FIG. 7 which uses MOS transistors 41 and 42 having a size ratio of 1:N.

The current mirror circuits shown in FIGS. 7 and 8 use NMOS transistors. However, it is also possible to implement a current mirror circuit using PMOS transistors.

Second Embodiment

Figure 9:
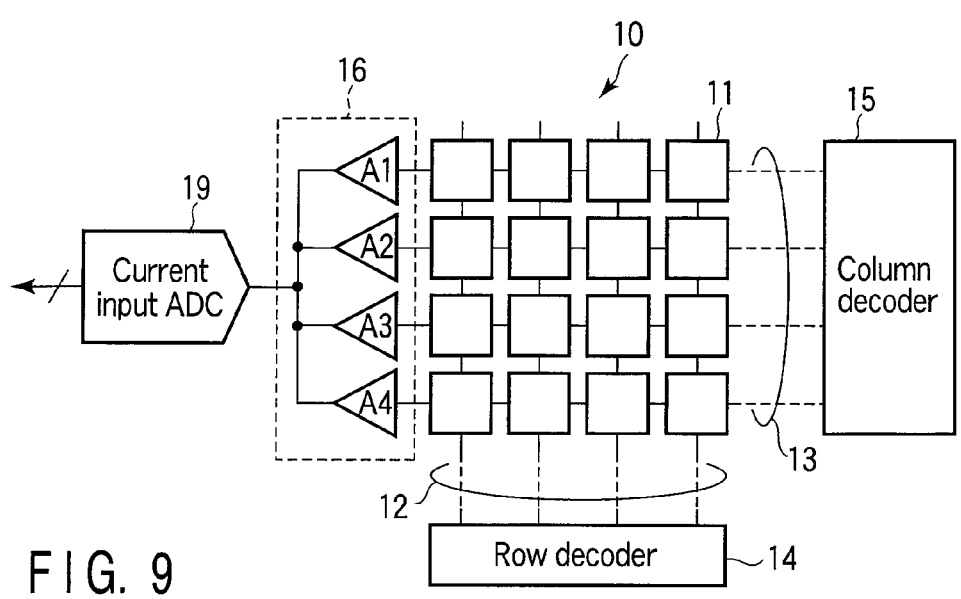
FIG. 9 is a circuit diagram showing a magnetic memory device according to the second embodiment.

FIG. 9 shows a magnetic memory device according to the second embodiment of the present invention. The same reference numerals as in FIG. 1 denote the same parts in FIG. 9, and points different from the first embodiment will be described. In the second embodiment the added current signal output from a current amplification block 16 shown in FIG. 1 is directly input to a current input ADC 19.

ADC 19 can use, e.g., a current input ADC described in Y. Sugimoto et al., "A low-voltage, high-speed and low-power full current-mode video-rate CMOS A/D converter", Proc. of Eur. Solid-State Circuits Conf., pp. 392-395, September 1997 (Document 2).

As described above, according to this embodiment, it is possible to implement a magnetic memory device fundamentally having the same effect as in the first embodiment, although it requires a special ADC, i.e., the current input ADC 19. Since the added current signal from the current amplification block 16 is directly input to ADC 19, the circuit scale can be smaller than in the first embodiment in which the added current signal is converted into a voltage signal and then input to ADC 18. ADC 19 can also accurately convert the added current signal from the current amplification block 16 into a digital signal without being affected by the variation of the output resistance of current amplifiers A1 to A4 or the input resistance of ADC 18 in the manufacturing process.

According to the present invention, bit lines are put into groups. After weighting addition is performed for currents flowing on bit lines in a selected group, analog-to-digital conversion is performed. This makes it possible to execute high-speed read by reading stored data at once for each word line without increasing the circuit scale.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a plurality of word lines;
   a plurality of bit lines which intersect the word lines and are put into groups;

a plurality of memory cells which are arranged at intersections between the bit lines and the word lines, each memory cell including a magnetic element and a transistor which are connected in series;
a first decoder which sequentially selects the word lines;
a second decoder which sequentially drives the bit lines of each group;
a weighting adder which performs weighting addition of currents flowing on bit lines in a selected group to generate an added current signal;
a current/voltage converter which converts the added current signal into a voltage signal; and
an analog-to-digital converter which digitizes the voltage signal.

2. The device according to claim 1, wherein the weighting adder performs the weighting addition using a weighting factor which is a power of 2.

3. The device according to claim 1, wherein the weighting adder includes a plurality of current amplifiers which have different gains and amplify the currents flowing on the bit lines in the selected group to generate amplified currents.

4. The device according to claim 3, wherein the weighting adder is configured to generate the added current signal by adding the amplified currents.

5. The device according to claim 3, wherein the gains of said plurality of current amplifiers have a ratio of powers of 2.

6. The device according to claim 3, wherein the current amplifier includes a current mirror circuit.

7. The device according to claim 6, wherein the current mirror circuit includes a first transistor and a second transistor, whose size ratio changes between the current amplifiers.

8. The device according to claim 6, wherein the current mirror circuit includes a first MOS transistor and a second MOS transistor, and a ratio of a channel width/channel length ratio of the first MOS transistor to a channel width/channel length ratio of the second MOS transistor is set to change between the current amplifiers.

9. A magnetic memory device comprising:
a plurality of word lines;
a plurality of bit lines which intersect the word lines and are put into groups;
a plurality of memory cells which are arranged at intersections between the bit lines and the word lines, each memory cell including a magnetic element and a transistor which are connected in series;
a first decoder which sequentially selects the word lines;
a second decoder which sequentially drives the bit lines of each group;
a weighting adder which performs weighting addition of currents flowing on bit lines in a selected group to generate an added current signal; and
an analog-to-digital converter which digitizes the added current signal.

10. The device according to claim 9, wherein the weighting adder performs the weighting addition using a weighting factor which is a power of 2.

11. The device according to claim 9, wherein the weighting adder includes a plurality of current amplifiers which have different gains and amplify the currents flowing on the bit lines in the selected group to generate amplified currents.

12. The device according to claim 11, wherein the weighting adder is configured to generate the added current signal by adding the amplified currents.

13. The device according to claim 11, wherein the gains of said plurality of current amplifiers have a ratio of powers of 2.

14. The device according to claim 11, wherein the current amplifier includes a current mirror circuit.

15. The device according to claim 14, wherein the current mirror circuit includes a first transistor and a second transistor, whose size ratio changes between the current amplifiers.

16. The device according to claim 14, wherein the current mirror circuit includes a first MOS transistor and a second MOS transistor, and a ratio of a channel width/channel length ratio of the first MOS transistor to a channel width/channel length ratio of the second MOS transistor is set to change between the current amplifiers.

17. A magnetic memory device comprising:
a plurality of word lines;
a plurality of bit lines which intersect the word lines and are put into groups;
a plurality of memory cells which are arranged at intersections between the bit lines and the word lines, each memory cell including a magnetic element and a transistor which are connected in series;
a first decoder which sequentially selects the word lines;
a second decoder which sequentially drives the bit lines of each group;
a weighting adder which performs weighting addition of currents flowing on bit lines in a selected group to generate an added current signal;
a current/voltage converter which converts the added current signal into a voltage signal; and
an analog-to-digital converter which digitizes the voltage signal,
wherein the weighting adder performs the weighting addition using a weighting factor which is a power of 2.

18. A magnetic memory device comprising:
a plurality of word lines;
a plurality of bit lines which intersect the word lines and are put into groups;
a plurality of memory cells which are arranged at intersections between the bit lines and the word lines, each memory cell including a magnetic element and a transistor which are connected in series;
a first decoder which sequentially selects the word lines;
a second decoder which sequentially drives the bit lines of each group;
a weighting adder which performs weighting addition of currents flowing on bit lines in a selected group to generate an added current signal;
a current/voltage converter which converts the added current signal into a voltage signal; and
an analog-to-digital converter which digitizes the voltage signal,
wherein the weighting adder includes a plurality of current amplifiers which have different gains and amplify the currents flowing on the bit lines in the selected group to generate amplified currents.

19. The device according to claim 18, wherein the weighting adder is configured to generate the added current signal by adding the amplified currents.

20. The device according to claim 18, wherein the gains of said plurality of current amplifiers have a ratio of powers of 2.

21. The device according to claim 18, wherein the current amplifier includes a current mirror circuit.

22. The device according to claim 21, wherein the current mirror circuit includes a first transistor and a second transistor, whose size ratio changes between the current amplifiers.

23. The device according to claim 21, wherein the current mirror circuit includes a first MOS transistor and a second MOS transistor, and a ratio of a channel width/channel length ratio of the first MOS transistor to a channel width/channel length ratio of the second MOS transistor is set to change between the current amplifiers.

24. A magnetic memory device comprising:
a plurality of word lines;
a plurality of bit lines which intersect the word lines and are put into groups;
a plurality of memory cells which are arranged at intersections between the bit lines and the word lines, each memory cell including a magnetic element and a transistor which are connected in series;
a first decoder which sequentially selects the word lines;
a second decoder which sequentially drives the bit lines of each group;
a weighting adder which performs weighting addition of currents flowing on bit lines in a selected group to generate an added current signal; and
an analog-to-digital converter which digitizes the added current signal,
wherein the weighting adder performs the weighting addition using a weighting factor which is a power of 2.

25. A magnetic memory device comprising:
a plurality of word lines;
a plurality of bit lines which intersect the word lines and are put into groups;
a plurality of memory cells which are arranged at intersections between the bit lines and the word lines, each memory cell including a magnetic element and a transistor which are connected in series;
a first decoder which sequentially selects the word lines;
a second decoder which sequentially drives the bit lines of each group;
a weighting adder which performs weighting addition of currents flowing on bit lines in a selected group to generate an added current signal; and
an analog-to-digital converter which digitizes the added current signal,
wherein the weighting adder includes a plurality of current amplifiers which have different gains and amplify the currents flowing on the bit lines in the selected group to generate amplified currents.

26. The device according to claim 25, wherein the weighting adder is configured to generate the added current signal by adding the amplified currents.

27. The device according to claim 25, wherein the gains of said plurality of current amplifiers have a ratio of powers of 2.

28. The device according to claim 25, wherein the current amplifier includes a current mirror circuit.

29. The device according to claim 28, wherein the current mirror circuit includes a first transistor and a second transistor, whose size ratio changes between the current amplifiers.

30. The device according to claim 28, wherein the current mirror circuit includes a first MOS transistor and a second MOS transistor, and a ratio of a channel width/channel length ratio of the first MOS transistor to a channel width/channel length ratio of the second MOS transistor is set to change between the current amplifiers.

* * * * *